United States Patent [19]
Coon

[11] Patent Number: 4,603,401
[45] Date of Patent: Jul. 29, 1986

[54] APPARATUS AND METHOD FOR INFRARED IMAGING

[75] Inventor: Darryl D. Coon, Pittsburgh, Pa.

[73] Assignee: University of Pittsburgh, Pittsburgh, Pa.

[21] Appl. No.: 600,569

[22] Filed: Apr. 17, 1984

[51] Int. Cl.$^4$ ............................................. G11C 13/00
[52] U.S. Cl. ..................................... 365/114; 365/125
[58] Field of Search ........................ 365/114, 125, 127

[56] References Cited

U.S. PATENT DOCUMENTS

| | | | |
|---|---|---|---|
| 2,677,714 | 5/1954 | Auwarter | 136/89 |
| 3,182,198 | 5/1965 | Mahlman | 250/211 |
| 3,341,825 | 9/1967 | Schrieffer | 365/106 |
| 3,398,316 | 8/1968 | Morton et al. | 315/10 |
| 3,623,026 | 11/1971 | Engeler | 365/114 |
| 3,652,270 | 3/1972 | Yamashita | 96/1.5 |
| 3,904,911 | 9/1975 | Welsch | 313/336 |
| 4,107,564 | 8/1978 | Klimin et al. | 313/94 |
| 4,225,222 | 9/1980 | Kempter | 355/3 DR |
| 4,265,991 | 5/1981 | Hirai et al. | 430/64 |
| 4,349,617 | 9/1982 | Kawashiri et al. | 430/59 |
| 4,356,246 | 10/1982 | Tabei et al. | 430/136 |
| 4,359,512 | 11/1982 | Fukuda et al. | 430/65 |
| 4,359,514 | 11/1982 | Shimizu et al. | 430/65 |
| 4,394,426 | 7/1983 | Shimizu et al. | 430/65 |

OTHER PUBLICATIONS

C. R. McCrieght et al., "Infrared Charge-Injection-Device Array Performance at Low Background", Applied Optics, Sep. 15, 1981, vol. 20, No. 18.

Primary Examiner—Terrell W. Fears
Attorney, Agent, or Firm—Arnold B. Silverman

[57] ABSTRACT

An apparatus and method for infrared imaging is disclosed in which a pattern of infrared radiation is detected and stored in uniformly distributed localized states in a semiconductor. Photoemission of charge carriers from the localized states occurs only at locations where infrared photons interact with the carriers. When desired, a uniform electric field applied to the semiconductor allows for coherent transport of a pattern of remaining carriers in a direction substantially perpendicular to an outer surface to which the image is transported. A portion of the transported pattern of charge may be emitted from the outer surface of the semiconductor and utilized to produce an optical or electrical pattern corresponding to the incident infrared pattern.

38 Claims, 8 Drawing Figures

APPARATUS AND METHOD FOR INFRARED IMAGING

The present invention is partially sponsored by the Commonwealth of Pennsylvania, acting through the Board of the Ben Franklin Partnership Fund and the MPC Coporation.

BACKGROUND OF THE INVENTION

1. Field of the Invention

This invention relates to an apparatus and method for use in infrared imaging. More specifically, a pattern of infrared radiation is detected by and stored in substantially uniformly distributed localized states in a semiconductor.

2. Description of the Prior Art

Various types of radiation detectors and detection methods employing charge storage are known in the art.

U.S. Pat. No. 3,341,825, for example, discloses a quantum mechanical information storage system in which storage and retrieval of information is accomplished by scanning a storage medium with a beam of radiant energy. A bit of information is written or stored on a particular location on the material by a beam of light of a particular frequency or wavelength and is retrieved from the material with a beam of light of a different wave length. The memory material consists of a semiconductor material into which certain impurities are introduced to act as energy level traps for electrons. A light beam of a particular frequency impinging on the memory material at a particular position causes the energy level of electrons at that position to be raised from the valence level to a higher level called the storage level. The electrons remain at the storage level until they are raised to the conduction level by the action of a light beam of a frequency different from the first.

Additionally, U.S. Pat. No. 4,167,791 discloses a semiconductor memory device exhibiting nonvolatile information storage. The device comprises a storage element, maintained in a prescribed range of temperatures, which exhibits an effect of charge storage and release of the stored charge upon application of a suitable bias voltage. The device is, for example, exemplarily made of silicon in which the rectifying region consists of a region of highly doped p-type material and a region of highly doped n-type material and, in between the highly doped regions, a region of very lightly doped material. Information is stored by exposure to light or by applying a bias voltage to put the device into one of a multiplicity of long lived states. In the case of exposure to light the state of the device is indicative of the integrated photon flux. Shining light on the device at the initial bias, before applying a voltage sweep, results in a larger pulse being caused by said voltage sweep, although the pulse never exceeds a certain saturation size. Under appropriate conditions the size of the pulse is a monotonically increasing function of the total amount of light incident on the device.

The effect of the initial exposure to radiation in each of the prior art devices hereinbefore described is to cause an increase in the amount of charge stored in such devices. The effect of exposure to a pattern of infrared radiation with the present invention, on the other hand, is to cause a depletion of stored charge.

A major problem with detection systems which measure electrical signal output during exposures to radiation is that it is extremely difficult to measure low intensity infrared radiation with such devices because the electrical signal output is exceedingly small. To overcome this problem, external integration of the output signal may be utilized to accumulate a larger, more detectable signal over a period of time. With presently known integrating detectors, however, deleterious noise and other problems are introduced by the external transfer of information.

A problem with detection systems based on an increase in stored charge such as is described in the hereinbefore patents is that such systems require relatively large photon energy levels to excite carriers which can be trapped in localized states associated with typical impurity levels to cause an increase in the stored charge. As a result, for a particular localized state in a particular semiconductor, the wavelength range within which the amount of stored charge can be altered by radiation exposure is limited to relatively short wavelengths.

In addition to the radiation detection devices and methods described above, various types of infrared and other electromagnetic imaging devices are known. U.S. Pat. Nos. 3,182,198; 3,398,316; 3,652,270 and 4,265,991, for example, disclose some of these devices. None of these patents, however, teach or suggest an infrared imaging device in which an image or pattern of radiation is stored in the semiconductor by depletion of charge stored in localized states in a semiconductor caused by field-assisted photoemission. In U.S. Pat. No. 3,652,270 a dispersed mixture of material is utilized as a recording device. That system, however is not capable of providing or approaching the same degree of homogeneity as is provided by the present invention.

There remains, therefore, a need for an imaging device and method which is capable of detecting low intensities of infrared radiation while avoiding the problems associated with external integration of the output current. There remains a further need for an imaging device and method which provides in situ integration of radiation with lower photon energy to allow for the detection of much longer wavelengths of radiation with any particular semiconductor. There also remains a further need for an imaging device and method which can detect and store a pattern of infrared radiation in a single uniform semiconductor based on the depletion of charge stored in localized states of a semiconductor caused by field-assisted photoemission of charge carriers from the localized states.

SUMMARY OF THE INVENTION

The present invention provides a solution to the above-mentioned problems by providing an apparatus and method for infrared imaging in which a pattern of infrared radiation is detected by and stored in localized states of a semiconductor having an outer surface thereon. The localized states are substantially uniformly distributed throughout the semiconductor within planar regions which are substantially parallel to the outer surface. Photoemission of charge carriers from the localized states occurs only at locations where infrared photons interact with the localized states. A substantially uniform electric field is applied substantially perpendicular to the outer surface of the semiconductor to allow for coherent transport of the pattern of remaining charge carriers to an outer surface of the semiconductor. Accordingly, a pattern of infrared radiation which strikes the semiconductor is stored therein as a pattern of depleted charge and, when desired, the pattern of remaining carriers may be directly emitted from the outer surface and utilized to produce an optical or electrical output pattern corresponding to the incident infrared pattern.

It is an object of the present invention to provide an apparatus and method of infrared imaging in which radiation is detected and stored by the depletion of charge stored in localized states of a single uniform semiconductor caused by field-assisted photoemission of charge carriers from the localized states.

It is another object of the present invention to provide such an apparatus and method requiring less photon energy than systems which trap photoexcited carriers.

It is yet another object of the invention to provide such an apparatus and method which can be utilized to store a pattern of low intensity radiation of longer wavelength than systems which trap charge carries excited by radiation.

It is yet another object of the invention to provide an infrared imaging apparatus and method having long term internal signal integration capabilities.

It is still another object of the invention to provide an infrared imaging apparatus and method in which a pattern of infrared radiation is stored in a uniform region of a semiconductor, the storage of which is analogous to the storage of an image in photographic film, but with the pattern being based on the depletion of charge stored in localized states.

It is yet another object of the present invention to provide an imaging apparatus and method providing a high degree of homogeneity by utilizing localized states in a semiconductor as a storage means.

It is yet another object of the invention to provide an imaging system which avoids the necessity of providing a complicated detector array architecture to store an infrared image.

These and other objects of the invention will be more fully understood from the following description of the presently preferred embodiments of the invention on reference to the illustrations appended hereto.

DESCRIPTION OF THE PREFERRED EMBODIMENTS

Figure 1:
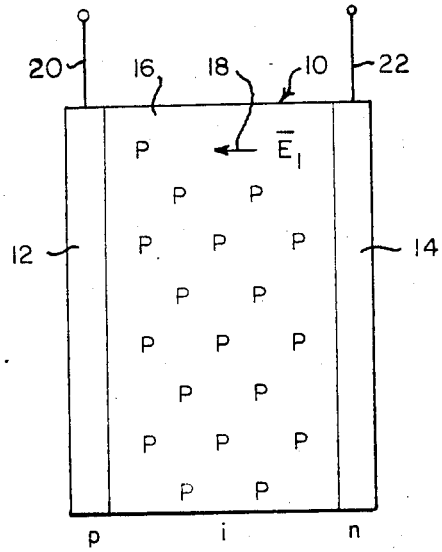
FIG. 1 illustrates schematically a semiconductor having a p-layer, an n-layer, and an i-layer therebetween containing charge stored in localized states associated with phosphorus impurities.

As used herein, the phrases "my copending invention" and "my copending application" refer to the invention disclosed in a U.S. patent application, Ser. No. 06/601,230, entitled "APPARATUS AND METHOD FOR DETECTION OF INFRARED RADIATION" to Darryl D. Coon and Gustav E. Derkits, Jr., filed on Apr. 17, 1984, which is also the filing date of the present application. My copending application has been assigned to the assignee of the present invention and the disclosure of my copending application is incorporated herein by reference.

The present invention is described herein as an apparatus and method for storing an infrared image. The invention, however, is not limited solely to uses with infrared radiation and may be utilized in connection with varying other electromagnetic wavelength range.

My copending application discloses a detector and detection method in which infrared radiation is detected by electrical measurement of the depletion of charge stored in localized states of a semiconductor caused by field-assisted photoemission of charge carriers from the localized states. The photon energy required to cause a depletion of stored charge by photoemission is significantly less than that required to excite carriers which can be trapped in localized states. As a result, that invention and the present invention may be advantageously utilized to detect longer wavelengths of radiation than systems which trap charge carriers excited by radiation. In the case of localized states associated with phosphorus impurities in silicon, for example, wavelengths of about one micrometer or less would be required to photoexcite valence band electrons which could be trapped in phosphorus levels near the conduction band, thereby increasing the amount of charge stored in localized states. With my copending invention and with the present invention, however, wavelengths of up to about 27 micrometers or greater may be utilized by causing depletion of charge trapped in the phosphorous impurity levels in silicon. The long wavelengths associated with depletion of charge by means described herein are especially desirable for the detection and storage of infrared radiation patterns Additionally, my copending and the present inventions may advantageously be used for detecting low intensity infrared radiation because of their unique capabilities of long term internal signal integration, as opposed to the external integration methods currently in use. The clear cut solid state physics associated with my copending invention and with the imaging method and apparatus of the present invention is useful in achieving high performance and the apparatus' internal integration capability reduces undesired noise and other problems associated with the external transfer of information.

In its simplest form, the detection method of my copending invention involves the steps of: storing charge in localized states in a semiconductor; maintaining the temperature of the semiconductor sufficiently low to avoid any appreciable thermal excitation of charge carriers out of the localized states; applying a first electric field to the localized states; exposing the semiconductor to infrared radiation having sufficient energy to cause photoemission of charge from the localized states; and determining the extent of depletion of charge caused by the photoemission. The apparatus used in connection with that above-described method includes a semiconductor having localized states therein and suitable means for accomplishing each of the hereinbefore-mentioned steps.

The present invention differs from and is an improvement and extension of my copending invention in that my copending application discloses a detector and method capable of measuring only the total quantity of infrared radiation which strikes any single detector or element of an array. The present invention, on the other hand, provides an apparatus and method capable of detecting and storing a pattern of infrared radiation on a single semiconductor. In other approaches, a complicated array may be required to accomplish the same result. In the present invention, the infrared pattern interacts with at least a portion of one or more parallel planar regions within the semiconductor. The infrared image storage method of the present invention employs the steps of: storing of charge in localized states in a semiconductor having an outer surface in a manner whereby said charge is stored in at least a portion of at least one planar region within the semiconductor which is substantially parallel to said outer surface, storing said charge in localized states which are substantially uniformly distributed in said planar region; maintaining the temperature of said semiconductor sufficiently low to avoid appreciable thermal excitation of charge carriers out of said localized states; applying a substantially uniform first electric field to at least the localized states in said planar region; exposing the semiconductor to a pattern of electromagnetic radiation having sufficient photon energy to cause photoemission of charge from said localized states whereby a first pattern of depleted localized states is created in said planar region corresponding to at least a portion of the radiation pattern to which the semiconductor has been exposed. The apparatus of the present invention includes a semiconductor as described-above and suitable means for accomplishing each of the above-mentioned steps.

The following refinements to the simplest form of the present invention described above apply equally to the method and to the apparatus of the invention.

The semiconductor of the present invention is preferably selected from the group consisting of silicon, germanium, gallium arsenide and semiconductor alloys such as $Ga_xAl_{1-x}As$, for example. The localized states in the semiconductor may comprise conduction band electrons, valence band holes or a combination of conduction band electrons and valence band holes, said electrons and/or holes being bound to either charged or neutral impurities.

One of the means contemplated for storing of charge in localized states is injection of charge carriers from one or more electrical contacts which are electrically connected to the semiconductor whereby the charge carriers are captured and trapped in substantially uniformly distributed localized states. In this regard, the electrical contacts may comprise heavily doped n-type regions, heavily doped p-type regions, or heavily doped n-type and heavily doped p-type regions of the semiconductors.

More specifically, one means of storing charge in the i-region of a p-i-n diode, for example, consists of electrical injection of carriers by means of a temporary forward bias voltage applied to the p-i-n diode. Such a temporary forward bias voltage could be applied using an electronic waveform generator or electronic pulse generator electrically connected to the diode. Waveform generators or waveform generators supplemented by amplifiers have sufficient flexibility to apply, change or maintain potential differences between electrical contacts, and thereby to apply, change or maintain the electric fields required during photoemission and for the release of charge by field ionization.

The temperature of the semiconductor may be maintained sufficiently low by cooling it with liquid helium or by any other suitable means which are well known. It will be obvious to those skilled in the art that the temperature requirements for any particular application will depend on the length of integration time required. As the temperature increases, the percentage of the stored charge depleted by thermal excitation will increase relative to the percentage depleted by photoemission. In addition, undesirable fluctuations in the amount of depletion caused by thermal excitation will increase with increasing temperatures. A suitable temperature for a silicon semiconductor having phosphorus impurities, for example, could be in the range of about 0 degrees to 16 degrees Kelvin.

The first electric field applied to the localized states may be maintained by providing a potential difference between electrical contacts provided on the semiconductor or by any other suitable means. Such a potential difference could be provided, for example, by a voltage waveform generator. Preferably the field has a moderate strength as compared to the lower electric fields applied to many known detectors and image devices. For a silicon semiconductor having phosphor impurities a field strength of 0.4 volts per micrometer, for example, would provide a suitable strength. The first electric field, however, should have a strength which is sufficiently low (less than about 0.8 volts per micrometer for phosphorus impurities in silicon) to avoid appreciable depletion of charge stored in localized states in the absence of infrared radiation. The photon energy required to cause photoemission from a localized state is normally greater than the binding energy or zero-field ionization energy of the localized state. For example, 0.045 electron volts is the binding energy for phosphorus impurities in silicon. However, the required photon energy can be lowered by the applied field. The range of photon energy patterns detectable and storable according to the present invention, however, may advantageously be varied by altering the strength of the first electric field.

One means of exposing the semiconductor to infrared radiation consists of admitting infrared radiation into the semiconductor through the p-layer or n-layer by making at least one such layer sufficiently thin (for example, about one micron or less) to efficiently transmit infrared radiation. The radiation could be thermal radiation from any warm body or any particular area or scene. One example of an application in which low intensity radiation might be integrated for long periods of time involves the detection of infrared radiation from space.

It will be obvious to those skilled in the art that exposing the semiconductor to a pattern of infrared radiation will, in effect, create a plurality of depletion patterns in parallel planar regions throughout the thickness of the semiconductor material. This is true because incoming infrared photons enter the semiconductor to varying depths. The sum of the patterns provided in planar regions at a plurality of depths within the semiconductor will correspond to substantially the entire radiation pattern to which the semiconductor has been exposed. A variety of ways are contemplated to determine the entire depletion pattern which has occurred throughout the thickness of the semiconductor.

In one such method a second electric field is applied to the semiconductor. The second field has a strength greater than the first field and is sufficient to cause the release of charge remaining in the localized states after exposure to infrared radiation. The second field is preferably provided in a direction perpendicular to the outer surface of the semiconductor to provide a means to transport the pattern of released charge carriers from all parallel planar regions within the semiconductor to the outer surface. A portion of the released charge may then be emitted from the outer surface and utilized to produce an optical or electrical pattern which corresponds to the infrared exposure pattern. The released charge pattern may be emitted from the outer surface of the semiconductor by any suitable method or means. One possible method for emitting charge from a surface is disclosed in U.S. Pat. No. 4,107,564, the specification of which is hereby expressly incorporated herein.

The emission pattern described herein may be converted into a visible pattern, for example, by providing a microchannel plate for amplifying the emitted pattern and directing the amplified pattern to a phosphor screen to produce a visible pattern by electron impact induced luminescence.

Another possible method for determining the entire pattern of released charge caused by the second field is to determine the pattern of an electric field associated with the space charge due to ionization of localized states. Yet another possible method contemplates the sequential repopulating of the localized states from which charge has been released during exposure to the infrared radiation pattern and the measuring of charge required to repopulate the localized states. In this regard, sequential repopulation could be accomplished, for example, by scanning an electron beam across the semiconductor.

Figure 4:
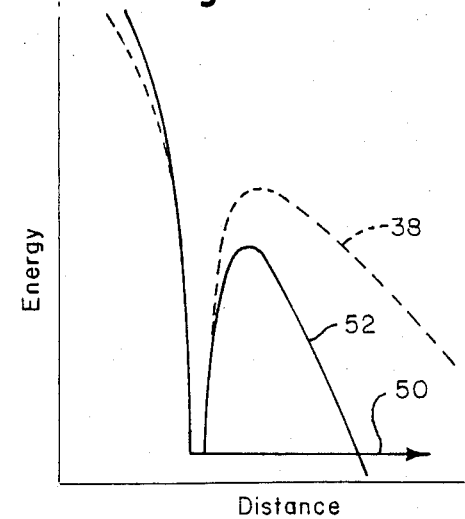
FIG. 4 is a plot of a reduced electron potential energy barrier caused by the application of a stronger electric field than that of FIG. 2 and the emission of electrons by ground state field ionization.
Figure 5:
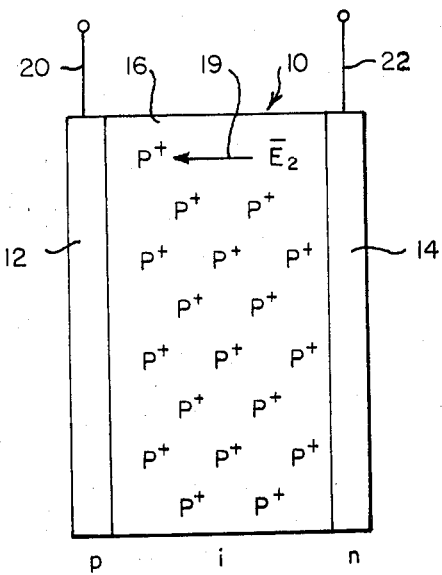
FIG. 5 illustrates schematically the semiconductor of FIG. 1 after the application of a strong electric field and shows the total depletion of charge from localized states.
Figure 6:
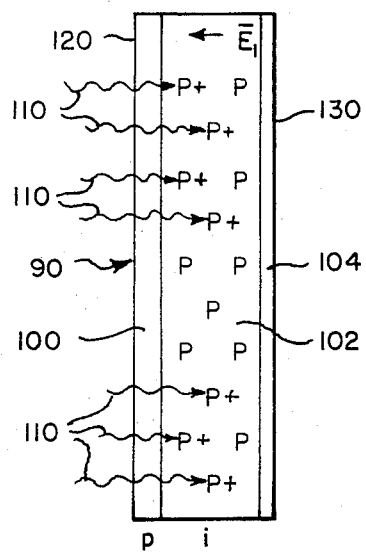
FIG. 6 illustrates schematically a semiconductor having a p-layer and an i-layer containing charge stored in localized states associated with phosphorus impurities during exposure to a pattern of infrared radiation.
Figure 7:
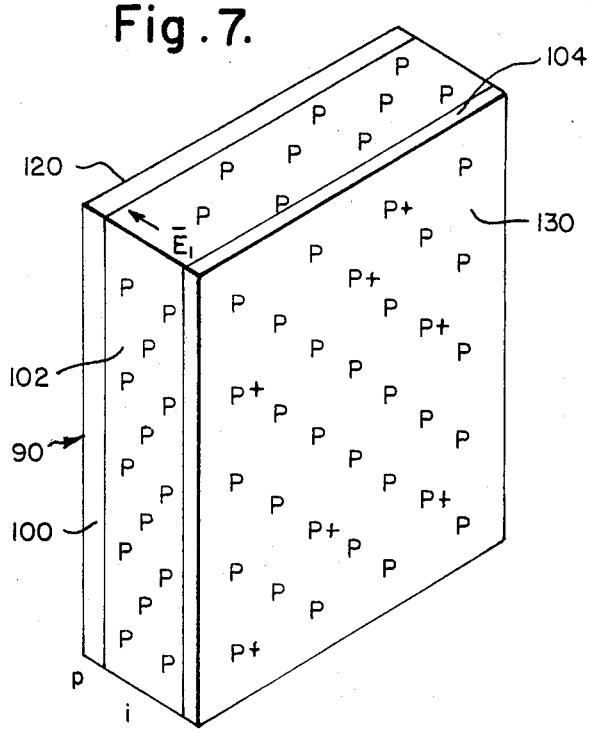
FIG. 7 is an isometric view of the semiconductor of FIG. 6 and illustrates schematically the pattern of locations where infrared photons have induced photoemission of electrons from the phosphorus impurity atoms.
Figure 8:
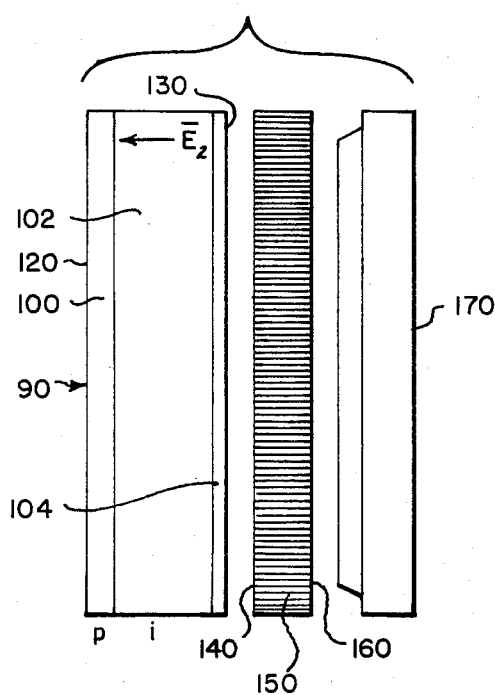
FIG. 8 illustrates schematically an infrared imaging system including a semiconductor as shown in FIG. 6, a microchannel plate and a phosphor screen.

Referring specifically to the figures, FIGS. 1 through 5 related generally to the detector and method disclosed in my copending application and FIGS. 6 through 8 relate exclusively to the present invention.

Referring to FIG. 1, a semiconductor 10 is provided. In the form shown, the semiconductor is formed of silicon and has a p-layer 12 heavily doped with boron, for example, an n-layer 14 heavily doped with phosphorus and an i-layer 16 therebetween containing charge stored in localized states associated with phosphorus impurities P. P represents phosphorus atoms including electrons in each atom's ground state energy level. An electric field $\bar{E}_1$ is provided in the direction of arrow 18 by means of electrical leads 20 and 22.

Figure 2:
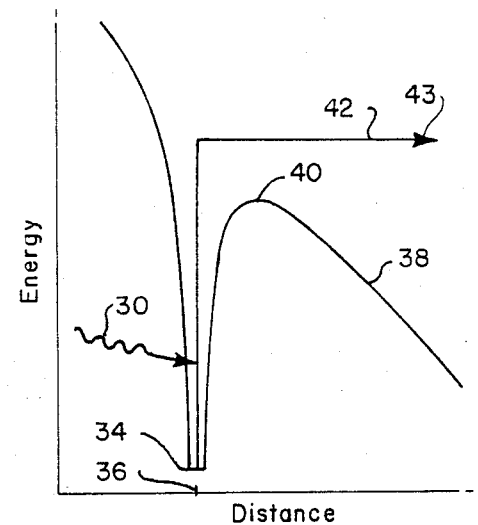
FIG. 2 is a plot of an electron potential energy barrier and the infrared induced photoemission of an electron from a phosphorus impurity atom in the presence of an applied electrical field.

Referring now to FIG. 2, a plot of an infrared induced photoemission of an electron from a phosphorus impurity atom in the presence of an applied electrical field is shown. In both FIGS. 2 and 4, energy is shown on the ordinate or y-axis and distance is shown on the abscissa or x-axis. An infrared photon 30 is shown interacting with the phosphorus atom. The phosphorus atom's electron ground state energy level is shown at 34 and the center of the atom is indicated at 36. The atom's electron potential energy barrier is indicated as 38 and the height 40 of energy barrier 38 controls the range of photon energy which is detectable. In FIG. 2, photon 30 is shown to have sufficient energy to cause an electron of the phosphorus atom to be photoemitted. The photoemitted electron is shown at 42 and is caused to move in the direction of arrow 43 by the applied field $\bar{E}_1$ shown in FIG. 1.

Figure 3:
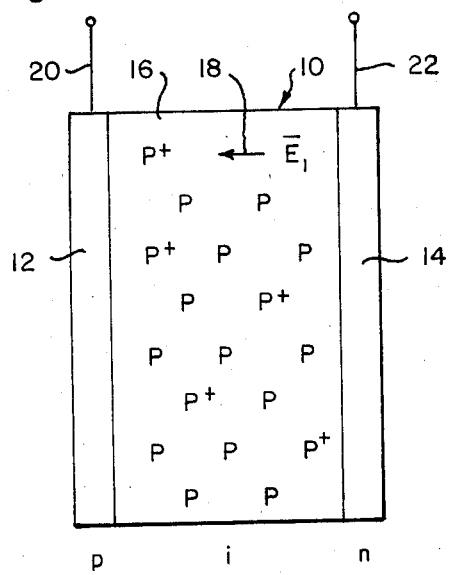
FIG. 3 illustrates schematically the semiconductor of FIG. 1 after exposure to infrared radiation showing a partial depletion of charge in the localized states.

FIG. 3 illustrates the semiconductor of FIG. 1 after exposure to infrared radiation. Phosphorus atoms P which have lost their most weakly bound electrons become positively charged phosphorus ions P+ as shown. FIG. 3, therefore, shows the partial depletion of charge in the localized states caused by infrared photoemission.

FIG. 4, which corresponds generally to the illustration shown in FIG. 2, illustrates the emission of electrons 50 by ground state field ionization. FIG. 4 shows that the application of a stronger field $\bar{E}_2$ (see FIG. 5) causes a reduced electron potential energy barrier 52 as compared to barrier 38 of FIG. 2 and allows the electrons 50 to escape from their respective atoms under the force of field $\bar{E}_2$ by tunneling through barrier 52. Barrier 52 is generated by a combination of the potential associated with $\bar{E}_2$ and the Coulomb potential which binds the electron in the phosphorus atom. Barrier 52 is lower and less thick than barrier 38 (FIG. 2) thereby allowing for easier escape.

FIG. 5 illustrates the semiconductor of FIG. 1 after the application of a strong electric field $\bar{E}_2$ in the direction of arrow 19. Note that i-region 16 now contains only phosphorus ions P+ and that the charge is now totally depleted from the localized states.

FIGS. 6 and 7 illustrate schematically a semiconductor 90 according to the present invention which has p-type layer 100, an i-type layer 102 and an extremely thin layer 104 having suitable characteristics to enhance the removal of released charge from the semiconductor. As shown in FIGS. 6 and 7, a pattern of infrared photons 110 are directed to enter outer surface 120 of p-layer 100 and into i-layer 102. In the i-layer each photon interacts with a phosphorus atom P which in the presence of applied field $\bar{E}_1$ causes an electron to be photoemitted therefrom. Phosphorus atoms which have lost an electron become phosphorus ions P+. It will be obvious to those skilled that each photon 110 may enter semiconductor 90 to a different depth. The semiconductor 90 may be thought of as having a plurality of planar regions therein which are parallel to outer surfaces 120 and 130 of the semiconductor. By this process, semiconductor 90 may be utilized as an infrared image storage means or film, in much the same way as an image of visible light is stored in photographic film, except the image in the present invention is based on depletion of charge from uniformly distributed localized states.

One of the methods contemplated for retrieving the stored image is shown in FIG. 8. In FIG. 8, a semiconductor 90, a microchannel plate 150 and phosphor imaging screen 170 are shown. A sufficiently strong electrical field $\bar{E}_2$ is applied to the semiconductor 90 in a direction substantially perpendicular to outer surfaces 120 and 130. The charge carriers of the remaining phosphorus atoms are totally depleted by field $\bar{E}_2$ and the pattern of remaining charge carriers is coherently transported by field $\bar{E}_2$ directly to surface 130. A portion of the pattern of remaining charge carriers on surface 130 may be emitted from said surface and caused to enter end 140 of microchannel plate 150. Microchannel plate 150 acts as an amplifier and the output pattern leaving output end 160 thereof has sufficient energy to create a visible image on phosphor screen 170 by electron impact induced luminescence. The image appearing on screen 170 corresponds to the pattern of infrared photons striking the semiconductor 90. Once the image is produced in visible form, it may be recorded in any number of ways which will be obvious to those skilled in the art.

It will be appreciated, therefore, that the present invention provides an apparatus and method for storing a pattern of infrared radiation in a semiconductor based on the depletion of charge carriers from uniformly distributed localized states in the semiconductor. It further provides a means and a method for retrieving and utilizing the pattern stored in the semiconductor to produce an optical or electrical pattern corresponding to the pattern of incident infrared radiation.

While I have shown and described certain presently preferred embodiments of the invention and have illustrated a present preferred method of practicing the same it is to be distinctly understood that the invention is not limited thereto but may be otherwise embodied within the scope of the following claims.

I claim:

1. A method for storing an electromagnetic image comprising the steps of:
    (a) storing of charge in localized states in a semiconductor having an outer surface in a manner whereby said charge is stored in at least a portion of at least one planar region within the semiconductor which is substantially parallel to said outer surface, said charge stored in localized states which are substantially uniformly distributed in said planar region;
    (b) maintaining the temperature of said semiconductor sufficiently low to avoid appreciable thermal excitation of charge carriers out of said localized states;
    (c) applying a substantially uniform first electric field to at least the localized states in said planar region;
    (d) exposing the semiconductor to a pattern of electromagnetic radiation photons having sufficient photon energy to cause photoemission of charge from said localized states whereby a first pattern of depleted localized states is created in said planar region corresponding to at least a portion of the radiation pattern to which the semiconductor has been exposed.

2. A method according to claim 1 including storing of charge in localized states which comprise conduction band electrons bound to chared impurities.

3. A method according to claim 1 including storing of charge in localized states which comprise conduction band electrons bound to neutral impurities.

4. A method according to claim 1 including storing of charge in localized states which comprise valence band holes bound to charged impurities.

5. A method according to claim 1 including storing of charge in localized states which comprise valence band holes bound to neutral impurities.

6. A method according to claim 1 including storing of charge in localized states which comprise conduction and electrons and valence band holes bound to charged impurities.

7. A method according to claim 1 including storing of charge in localized states which comprise conduction band electrons and valence band holes bound to neutral impurities.

8. A method according to claim 1 including storing of charge in localized states of a semiconductor which is selected from the group consisting of silicon, germanium, gallium arsenide and semiconductor alloys.

9. A method according to claim 1 wherein exposing the semiconductor to a pattern of electromagnetic radiation creates additional patterns of depleted localized states in a plurality of additional parallel planar regions the sum of all of such patterns corresponding to substantially the entire radiation pattern to which the semiconductor has been exposed.

10. A method according to claim 9 further comprising the step of determining the sum of said depletion patterns.

11. A method according to claim 10 wherein determining said sum of depletion patterns is accomplished by applying a second electric field having a strength greater than said first field and sufficient to cause the release of charge remaining in the localized states after exposure to said radiation, said second field also causing the transport of said released charge from substantially all of the parallel planar regions within the semiconductor to said outer surface, and by emitting a portion of the released charge from the surface and determining the pattern of the emitted portion.

12. A method according to claim 11 including the applying of said second field in a direction substantially perpendicular to said outer surface.

13. A method according to claim 11 wherein determining the pattern of said emitted portion is accomplished by converting said pattern of emission into an optical pattern.

14. A method according to claim 11 wherein converting said pattern of emission into an optical pattern is accomplished by amplifying said emission pattern with a microchannel plate and producing a visible pattern by electron impact induced luminescence.

15. A method according to claim 9 wherein determining the sum of depletion patterns is accomplished by determining the pattern of an electric field associated with the space charge due to ionization of localized states.

16. A method according to claim 9 wherein determining the sum of depletion patterns is accomplished by sequentially repopulating localized states from which charge has been released during exposure to said pattern of radiation and by measuring the charge required to repopulate said localized states.

17. A method according to claim 16 wherein sequentially repopulating localized states is accomplished by scanning an electron beam across said semiconductor.

18. A method according to claim 1 further comprising the step of altering the strength of said first electric field to vary the range of photon energies which are stored.

19. A method according to claim 11 wherein determining the pattern of said emitted portion is accomplished by converting said pattern of emission into an electrical pattern.

20. An apparatus for storing electromagnetic radiation comprising:
    (a) a semiconductor having an outer surface and having localized states therein;
    (b) means for storage of charge in said localized states in the semiconductor in a manner whereby said charge is stored in at least a portion of at least one planar region within the semiconductor which is substantially parallel to said outer surface, said charge stored in localized states which are substantially uniformly distributed in said planar regions;

(c) means of maintaining the temperature of said semiconductor sufficiently low to avoid appreciable thermal excitation of charge carriers out of said localized states;

(d) means of applying a substantially uniform first electric field to at least the localized states in said planar region; and (e) means of exposing the semiconductor to a pattern of electromagnetic radiation having sufficient energy to cause photoemission of charge from said localized states whereby a first pattern of depleted localized states is created in said plane portion corresponding to at least a portion of the radiation pattern to which the semiconductor has been exposed.

21. An apparatus according to claim 20 wherein said localized states comprise conduction band electrons bound to charged impurities.

22. An apparatus according to claim 20 wherein said localized states comprise conduction band electrons bound to neutral impurities.

23. An apparatus according to claim 20 wherein said localized states comprise valence band holes bound to charged impurites.

24. An apparatus according to claim 20 wherein said localized states comprise valence band holes bound to neutral impurities.

25. An apparatus according to claim 20 wherein said localized states comprise conduction band electrons and valence band holes bound to charged impurities.

26. An apparatus according to claim 20 wherein said localized states comprise conduction band electrons and valence band hole bound to neutral impurities.

27. An apparatus according to claim 20 wherein said semicondutor is selected from the group consisting of silicon, germanium, gallium arsenide and semiconductor alloys.

28. An apparatus according to claim 20 wherein exposing the semiconductor to a pattern of electromagnetic radiation creates additional patterns of depleted localized states in a plurality of additional parallel planar regions the sum of all of such patterns corresponding to substantially the entire radiation pattern to which the semiconductor has been exposed.

29. An apparatus according to claim 28 further comprising means for determining the sum of said depletion patterns.

30. An apparatus according to claim 29 wherein means for determining said sum of depletion patterns further comprises means for applying a second electric field having a strength greater than said first field and sufficient to cause the release of charge remaining in the localized states after exposure to said radiation, said second field also causing the transport of said released charge from substantially all of the parallel planar regions within the semiconductor to said outer surface, means for emitting a portion of the released charge from the surface and means for determining the pattern of the emitted portion.

31. An apparatus according to claim 30 wherein means for applying said second field provides said field in a direction substantially perpendicular to said outer surface.

32. An apparatus according to claim 30 wherein said means for determining the pattern of emitted portion further comprises means for converting said pattern of emission into an optical pattern.

33. An apparatus according to claim 30 wherein means for converting said pattern of emission into a visible optical pattern further includes amplifying means for said emission pattern having a microchannel plate and means for producing a visible pattern by electron impact induced luminescence.

34. An apparatus according to claim 30 wherein means for determining the sum of depletion patterns includes means for determining the pattern of an electric field associated with the space charge due to ionization of localized states.

35. An apparatus according to claim 30 wherein means for determining the sum of depletion patterns includes means for sequentially repopulating localized states from which charge has been released during exposure to said pattern of infrared radiation and means for measuring the charge required to repopulate said localized states.

36. An apparatus according to claim 35 wherein means for sequentially repopulating localized states including means for scanning an electron beam across said semiconductor.

37. An apparatus according to claim 20 including means for altering the strength of said first electric field to vary the range of photon energies which are stored.

38. An apparatus according to claim 30 wherein said means for determining the pattern of emitted portion further comprises means for converting said pattern of emission into an electrical pattern.

* * * * *

UNITED STATES PATENT AND TRADEMARK OFFICE
CERTIFICATE OF CORRECTION

PATENT NO. : 4,603,401

DATED : July 29, 1986

INVENTOR(S) : Darryl D. Coon

It is certified that error appears in the above-identified patent and that said Letters Patent is hereby corrected as shown below:

Column 1, line 8, "Coporation" should be --Corporation--.

Column 2, line 32, there should be a comma --,-- after "however".

Column 2, line 40, "in situ" should be underscored.

Column 4, line 26, "range" should be --ranges--.

Column 4, line 52, there should be a period --.-- after "patterns".

Claim 2, column 9, line 53, "chared" should be --charged--.

Signed and Sealed this

Ninth Day of December, 1986

Attest:

DONALD J. QUIGG

*Attesting Officer*     Commissioner of Patents and Trademarks